(12) United States Patent
Ravi et al.

(10) Patent No.: US 7,572,052 B2
(45) Date of Patent: Aug. 11, 2009

(54) METHOD FOR MONITORING AND CALIBRATING TEMPERATURE IN SEMICONDUCTOR PROCESSING CHAMBERS

(75) Inventors: Jallepally Ravi, Santa Clara, CA (US); Maitreyee Mahajani, Saratoga, CA (US); Yi-Chiau Huang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 209 days.

(21) Appl. No.: 11/775,720

(22) Filed: Jul. 10, 2007

(65) Prior Publication Data

US 2009/0016406 A1 Jan. 15, 2009

(51) Int. Cl.
*G01K 15/00* (2006.01)
(52) U.S. Cl. .............................................. 374/1; 374/2
(58) Field of Classification Search ...................... 374/1, 374/2, 159, 126, 128
See application file for complete search history.

(56) References Cited

U.S. PATENT DOCUMENTS

| | | | | |
|---|---|---|---|---|
| 4,956,538 A | * | 9/1990 | Moslehi | 219/121.6 |
| 5,660,472 A | * | 8/1997 | Peuse et al. | 374/128 |
| 2004/0227928 A1 | * | 11/2004 | Bonne et al. | 356/43 |
| 2006/0086713 A1 | | 4/2006 | Hunter et al. | |
| 2007/0108385 A1 | * | 5/2007 | Mantese et al. | 250/338.3 |
| 2008/0002753 A1 | * | 1/2008 | Timans | 374/2 |

OTHER PUBLICATIONS

Sneh, et al article, Adsorption and Desorption Kinetics of $H_2O$ On A Fully Hydroxylated $SiO_2$ Surface, Dept. of Chemistry and Biochemistry, University of Colorado. Surface Science 364 (1996), pp. 61-78.

* cited by examiner

*Primary Examiner*—Andre J Allen
(74) *Attorney, Agent, or Firm*—Patterson & Sheridan, LLP

(57) ABSTRACT

The present invention provides a non-destructive method for monitoring and calibrating chamber temperature. One embodiment of the present invention provides a method for measuring temperature comprising forming a target film on a test substrate at a first temperature, wherein the target film has one or more properties responsive to thermal exposure, exposing the target film to an environment at a second temperature in a range higher than the first temperature, measuring the one or more properties of the target film after exposing the target film to the environment at the second temperature, and determining the second temperature according to the measured one or more properties.

23 Claims, 8 Drawing Sheets

METHOD FOR MONITORING AND CALIBRATING TEMPERATURE IN SEMICONDUCTOR PROCESSING CHAMBERS

BACKGROUND OF THE INVENTION

1. Field of the Invention

Embodiments of the present invention generally relate to method for monitoring and calibrating temperature in semiconductor processing chambers. More particularly, embodiments of the present invention relate to method for non destructive temperature measurement of semiconductor processing chambers operating at low temperatures.

2. Description of the Related Art

Shrinking feature size in semiconductor devices greatly increases the need for precise processing, which usually requires precise and uniform temperature control in a semiconductor processing chamber during processing. Precise temperature measurement during processing is critical to the ultimate quality of finished device on a substrate being processed.

Numerous methods may be used to monitor chamber temperature during processing depending on temperature and other parameters in a processing chamber during processing. Since a large portion of semiconductor processes are conducted in controlled environment, such as a vacuum environment, which is very sensitive to contamination, non-destructive temperature measurement methods, which do not interfere with processes performed in the processing chamber, are typically preferred.

Optical pyrometry, which samples and analyzes emitted thermal radiation from target objects, is one of the non-contact temperature measurement method often used in the state of the art processing chambers. Optical pyrometers may be positioned outside a processing chamber without contamination, interruption or interference with processing. However, optical pyrometry is limited to high temperatures, i.e. above about 500° C. because objects, such as semiconductor substrates, typically do not emit sufficient amounts of thermal radiation below 500° C.

For processing chambers configured to operate at temperatures below 500° C., no effective non-destructive temperature measurement method is available in the state of the art semiconductor processing.

Therefore, there is a need for apparatus and method for non-destructive temperature measurement effective at low temperatures.

SUMMARY OF THE INVENTION

Embodiments of the present invention generally provide a novel method for monitoring and calibrating chamber temperature. Particularly, embodiments of the present invention provide non-destructive methods for monitoring and calibrating chamber temperature.

One embodiment provides a method for measuring temperature comprising forming a target film on a test substrate at a first temperature, wherein the target film has one or more properties responsive to thermal exposure, exposing the target film to an environment at a second temperature in a range higher than the first temperature, measuring the one or more properties of the target film after exposing the target film to the environment at the second temperature, and determining the second temperature according to the measured one or more properties.

Another embodiment provides a method for measuring processing temperature of a process performed in a semiconductor processing chamber comprising depositing a target film on a test substrate, wherein one or more properties of the target film are responsive to thermal exposure, positioning the test substrate in the semiconductor processing chamber, performing a test process to the test substrate positioned in the semiconductor processing chamber, wherein the test process has substantially the same temperature settings as the process, obtaining values of the one or more properties of the target film after the test process, and determining temperature of the test process performed according to the obtained values of the one or more properties of the target film after the test process.

Yet another embodiment provides a method for measuring temperature comprising depositing a silicon dioxide film on a test substrate at a first temperature, wherein the silicon dioxide film has one or more properties responsive to thermal exposure, exposing the silicon dioxide film to an inert environment at a second temperature, wherein the second temperature is higher than the first temperature, obtaining values of the one or more properties of the silicon dioxide film to the inert environment at the second temperature, determining the second temperature according to obtained values of the one or more properties of the silicon dioxide film.

BRIEF DESCRIPTION OF THE DRAWINGS

So that the manner in which the above recited features of the present invention can be understood in detail, a more particular description of the invention, briefly summarized above, may be had by reference to typical embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides a method for monitoring and calibrating semiconductor processing chambers. Embodiments of the present invention comprises measuring physical and/or chemical property changes in a target film, for example a silicon dioxide film deposited by an ultra low temperature atomic layer deposition, due to thermal exposures in an inert ambient in a semiconductor processing chamber and relating the property changes of the target film to the temperature of the inert ambient, as well as the temperature of the semiconductor processing chamber. Methods of the present invention are able to measure chamber temperature from about 50° C. to melting point of silicon, i.e. 1414° C.

Figure 1:
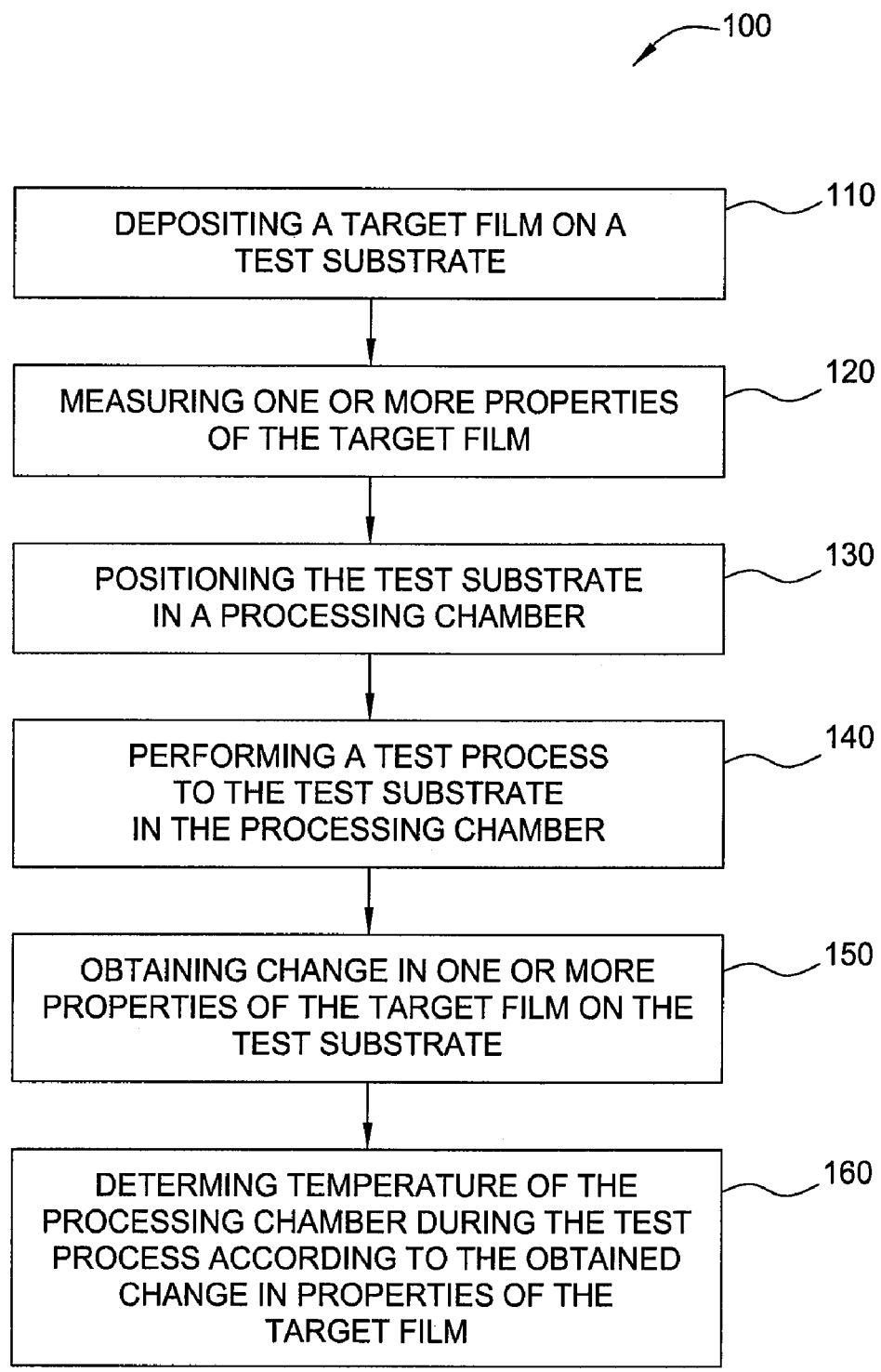
FIG. 1 illustrates a method for measuring chamber temperature in accordance with one embodiment of the present invention.

FIG. 1 illustrates a flow chart for a method 100 for measuring chamber temperature in accordance with one embodiment of the present invention. The method 100 allows non-destructive temperature measurement in semiconductor processing chambers in a temperature range from about 50° C. to about 1414° C.

Method 100 comprises depositing a target film on a test substrate, as shown in block 110. The test substrate may be a blank silicon substrate with a size compatible to the semiconductor processing chamber to be monitored.

In one embodiment, the target film is formed at a temperature lower than the temperature to be measured using the test substrate with the target film. The target film may be any film with one or more chemical and/or physical properties indicative of temperature of its ambient after formation. In one embodiment, the target film has one or more chemical and/or physical properties indicative of the highest temperature of an inert ambient it has been exposed to.

In one embodiment, the target film comprises a layer of silicon dioxide film generated on the test substrate using an ultra low temperature atomic layer deposition. In one embodiment, the temperature at which the target film is generated is at least about 25° C. below the temperatures to be measured by using the test substrate with the target film. An exemplary method for forming a target film of silicon dioxide is further described with FIG. 4.

As shown in block 120, the method 100 may comprise measuring one or more properties which may bear thermal footprints, such as for example thickness, density, densification, etch resistance, concentration of impurity, and stress, of the target film formed on the test substrate. The measured values of the one or more properties may be used to obtain values of change after temperature measurement. This step may be optional in some cases when an absolute value, instead of change, of a property of the target film relates to thermal experience of the target film. This step may also be omitted when deposition of the target film may be performed in mass and the properties of the target film are uniform among a batch of test substrates.

To measure temperature of a processing chamber, the test substrate with the target film is positioned in the processing chamber, as shown in block 130. The test substrate may be positioned in a processing position within the processing chamber as if a substrate is being processed in production.

After the test substrate is positioned in the processing chamber, a test process may be run in the processing chamber, as shown in block 140. In one embodiment, the test process generates an inert ambient with a substantially same temperature setting as a designated process for the processing chamber. For example, a test process for a chemical vapor deposition chamber may include setting the chamber temperature following the designated chemical vapor deposition recipe, setting chamber pressure similar to the designated chemical vapor deposition, and flowing one or more inert gases to the chamber, instead of reactant gases specified by the deposition recipe. Duration of the test process may be determined by several factors, such as properties of an individual processing chamber, and processes to be run by the chamber.

Upon completing the test process, the test substrate may be removed from the processing chamber and changes in the one or more properties of the target film may be obtained, as shown in block 150. This step may include measuring the same properties again and obtaining the changes in the one or more properties compared to their values prior to the test process. In another embodiment, a secondary process may be run to determine the one or more properties, for example a wet or dry etching process performed to the target film to obtain wet or dry etching resistance.

The method 100 further comprises determining temperature of the processing chamber during the test process according to the obtained value of the one or more properties of the target film after the test process, as shown in block 160. In one embodiment, determining the temperature of the processing chamber may be achieved using a correlation between values and/or change of values of the one or more properties of the target film and temperature the target film is exposed to. In one embodiment, the correlation may be a formula or a look up table. In another embodiment, the correlation may be predetermined using a series of test process running under the same or similar recipe as of in the step shown in block 140.

Figure 2A:
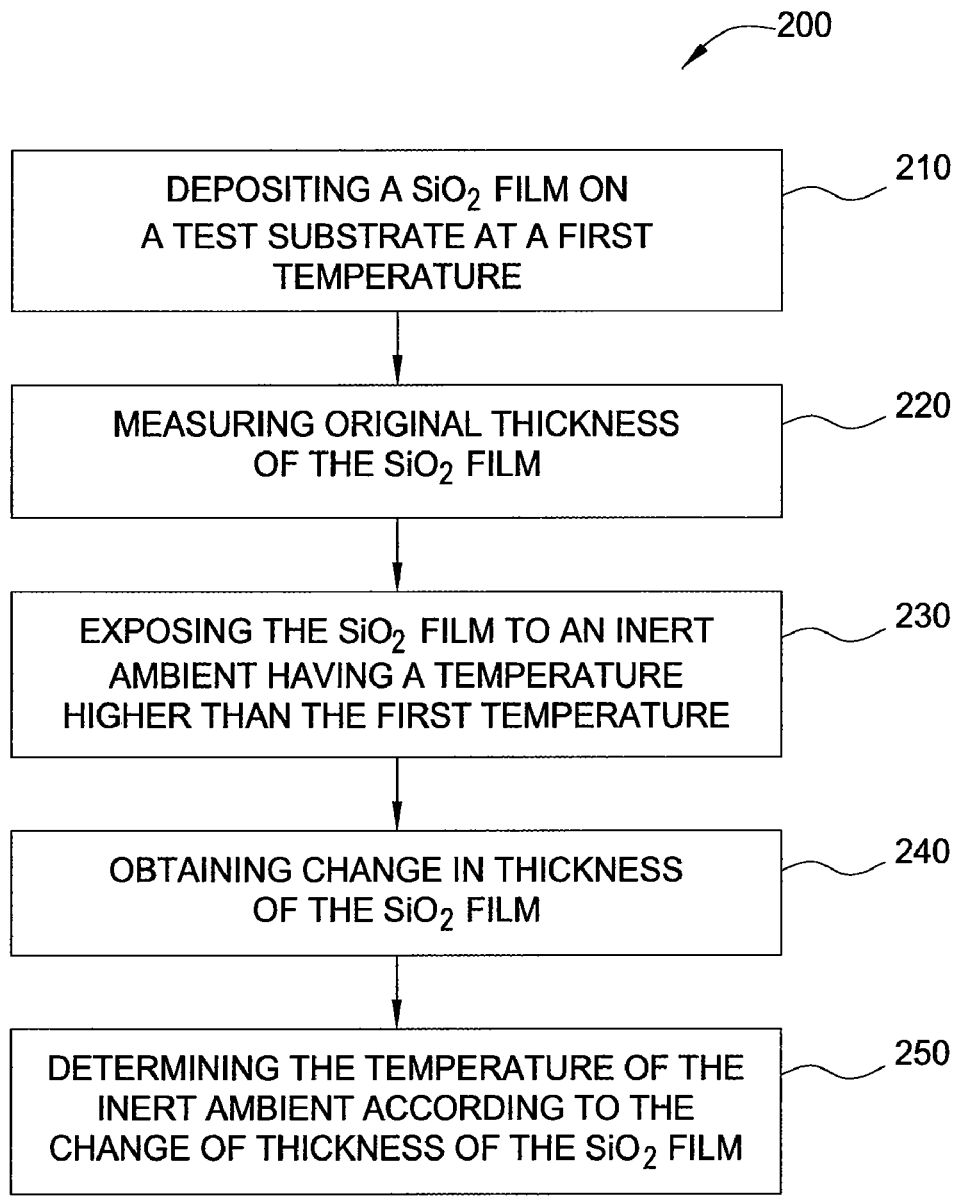
FIG. 2A illustrates a method for measuring chamber temperature according to change in thickness of a silicon dioxide film in accordance with one embodiment of the present invention.

FIG. 2A illustrates an exemplary method 200 for measuring chamber temperature from change in thickness of a silicon dioxide ($SiO_2$) film in accordance with one embodiment of the present invention. It has been observed that the thickness of the uniquely prepared silicon dioxide film may reduce upon exposing to higher temperature than the temperature the silicon dioxide is prepared. The amount of thickness change may be related to the temperature to which the silicon dioxide film is exposed.

In block 210, a unique silicon dioxide film is formed on a test substrate at a temperature lower than temperatures to be measured by the test substrate. In one embodiment, the silicon dioxide film is deposited on the test substrate by an ultra low atomic layer deposition using pyridine ($C_5H_5N$) as a catalyst and water as oxidization source. Pyridine allows oxidation of silicon precursor to occur at low temperatures, such as from about room temperature to about 160° C. The deposition of silicon dioxide film on the target substrate may be performed about 25° C. below the lowest temperature to be measured. In one embodiment, the silicon dioxide film deposited on the test substrate has a thickness of about 100 angstrom to about 10 micron.

Figure 4:
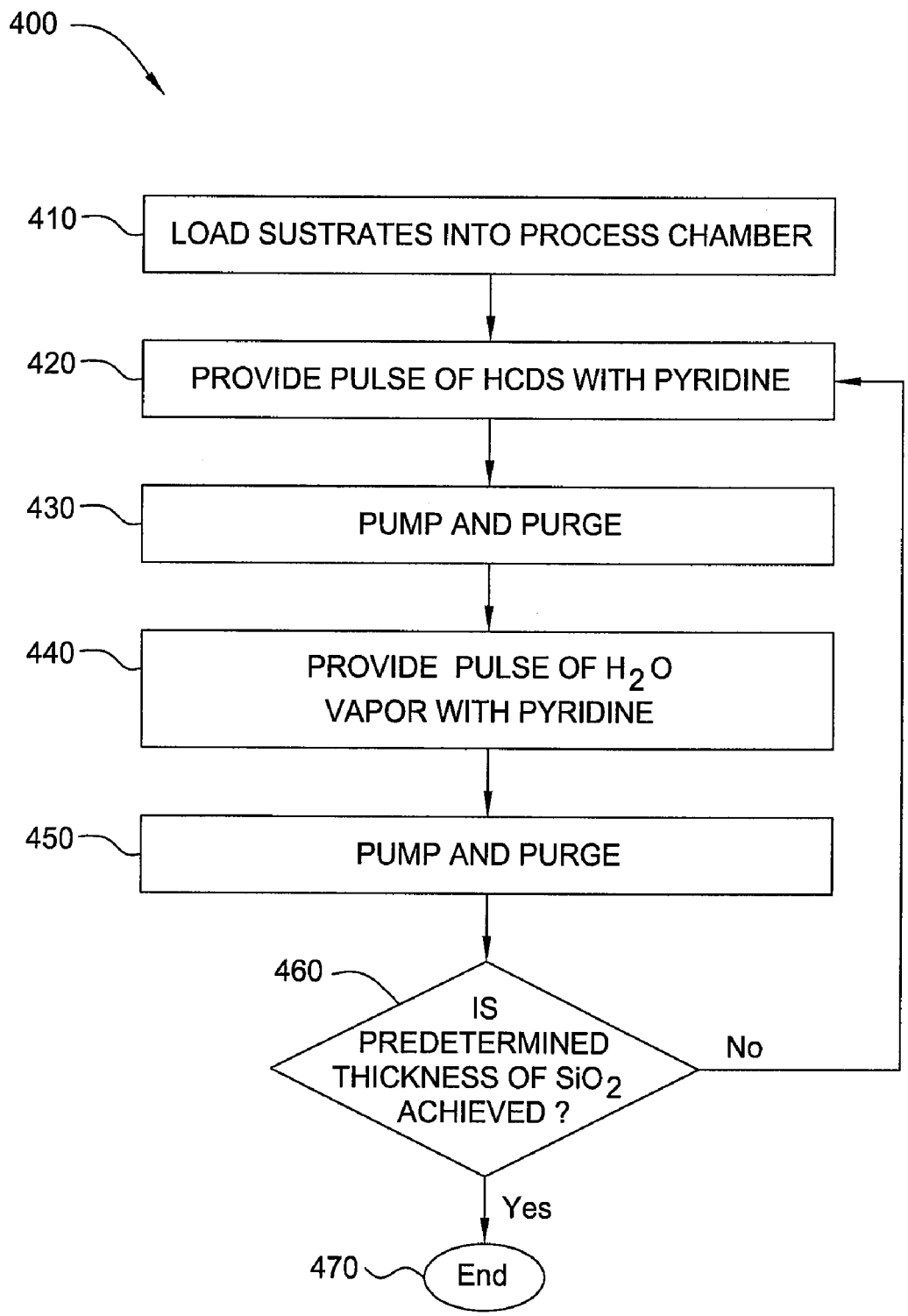
FIG. 4 illustrates a method for depositing a silicon dioxide film used for temperature measurement in accordance with one embodiment of the present invention.

FIG. 4 illustrates an exemplary method 400 for depositing a silicon dioxide film, which may be used in block 210. Initially, one or more substrates may be placed into a processing chamber configured to perform atomic layer deposition (ALD) on one or more substrates, shown in block 410.

An ALD chamber typically comprises a chamber body defining a vacuum enclosure configured to accommodate one or more substrates, an inject panel configured to provide processing gases, such as precursors, purge gases, and carrier gases to the vacuum enclosure, and an exhaust assembly configured to maintain a low pressure environment in the vacuum enclosure. During processing, sequential pulses of precursor gases separated by pulse of purge gas are supplied to the vacuum enclosure forming a film one atomic layer a time.

In one embodiment, the ALD chamber may be maintained at a pressure below about 10 Torr. In another embodiment, the ALD chamber pressure may be set to about 2 Torr to about 4 Torr.

In block 420, the one or more substrates in the ALD chamber are exposed to a pulse of silicon precursor comprising hexachlorodisilane (HCDS) along with pyridine. Silicon precursors such as HCDS do not interact with pyridine. Therefore, the silicon precursor and the pyridine may be co-flowed to the chamber using the same conduit and injector plenum. In one embodiment, the pyridine and the silicon precursor may be flowed to the chamber using the same conduit and injector plenum. In another embodiment, the pyridine and the silicon precursor may be flowed to the chamber using separate conduit and injector plenums.

Following the pulse of HCDS and pyridine, the ALD chamber may be purged by introducing a purge gas, usually an inert gas, such as argon, and nitrogen, into the ALD chamber, shown in block 430. The ALD chamber may then be pumped to remove the purge gas and any remaining HCDS and pyridine that may be present in the ALD chamber. In one embodiment, the pumping is not performed so that only a purging step is performed. Alternatively, the purge step may be eliminated so that the chamber is pumped to remove the HCDS and the pyridine. In one embodiment, the pumping may occur both before and after the purge gas introduction. In another embodiment, both the purging and the pumping may be repeated. The pumping and/or purging may occur a plurality of times. In yet another embodiment, the purging and the pumping may be combined into one step.

Following the pumping and/or purging, the one or more substrates in the ALD chamber may be exposed to a pulse of $H_2O$ and pyridine, shown in block 440. The $H_2O$ and the pyridine may be co-flowed through different conduit lines and into the ALD chamber through different inlets. By utilizing different conduits and different inlets, the $H_2O$ and pyridine may not be exposed to each other until they reach the chamber. If the pyridine and the $H_2O$ are co-flowed through the same conduit, the pyridine and the $H_2O$ may interact prior to reaching the chamber. When the $H_2O$ and the pyridine interact prior to entering the chamber, the effectiveness of the pyridine as a catalyst may be reduced so as to render the catalyst useless.

Following the exposure of the one or more substrates to $H_2O$, a second pumping and/or purging cycle, shown in block 450, may be performed under conditions as discussed above.

After the chamber has been pumped and/or purged, the thickness of the $SiO_2$ layer may be measured to determine if the predetermined thickness of $SiO_2$ has been reached, shown in block 460. If the predetermined thickness has not been reached, the deposition sequence may be repeated.

If the predetermined thickness has been reached, then the process ends as shown in block 470.

A $SiO_2$ film of the present invention may be formed using the following example.

EXAMPLE

Atomic Layer Deposition of SiO2

Chamber Pressure: 4 Torr (Pressure can be varied between 1-10 Torr)

HCDS Flow Rate: 500 sccm with Carrier Gas at 19° C.

Pyridine dosage: 500 sccm with Carrier Gas at 21° C. during HCDS flow

Water Vapor Flow Rate: 500 sccm with Carrier Gas at 30° C.

Pyridine dosage: 1000 sccm with Carrier Gas at 21° C. during Water Vapor flow

Deposition Temperature: 75° C.

Silicon Dioxide Film Thickness: about 400 Angstrom to 500 Angstrom.

Referring back to FIG. 2A, original thickness of the silicon dioxide film on the test substrate is measured, as shown in block 220. The test substrate may be stored in a low temperature environment prior to being used to measure a chamber temperature. In one embodiment, standard test substrates, test substrates with substantially the same properties, may be manufactured to eliminate measurement of the original thickness, providing accuracy and convenience to temperature measurement in accordance with the present invention.

In block 230, the target film on the test substrate is exposed to an inert ambient having a temperature higher than the temperature at which the target film is deposited. In one embodiment, the temperature of the inert ambient may be at least 25° C. higher than the deposition temperature.

In one embodiment, the inert environment may be generated in a processing chamber with temperature control capacities. A non-reactive gas, for example nitrogen, inert gas such as helium, or the combination thereof, may be flowing into the processing chamber. To measure a process temperature of a process performed in a processing chamber, a test process may be performed to the test substrate in the processing chamber. The test process may be set to generate an inert environment of substantially the same temperature as the process of interest. The inert environment may be achieved by following one or more inert gas to the processing chamber and the same temperature of the process of interest may be achieved by using the same temperature settings as the process of interest.

In one embodiment, the test substrate may be disposed in a processing chamber in a processing position so that the test substrate may be thermally exposed in a similar way as a substrate being processed. Therefore, embodiments of the present invention may be used to measure the actual temperature of the substrate during processing. In another embodiment, the test substrate may be positioned in locations other than a processing position to measure temperature in other areas of the processing chamber.

After the test substrate is exposed to an inert environment, the test substrate may be removed from the inert environment. The thickness of the silicon dioxide film may be remeasured, and a change of the thickness may be obtained by comparing the original thickness and remeasured thickness, as shown in block 240.

In block 250, the temperature of the inert environment may be determined according to the change of the thickness of the silicon dioxide film. In one embodiment, determination of the temperature of the inert environment may be achieved using a correlation between chamber temperatures and changes in thickness of the silicon dioxide film.

Figure 2B:
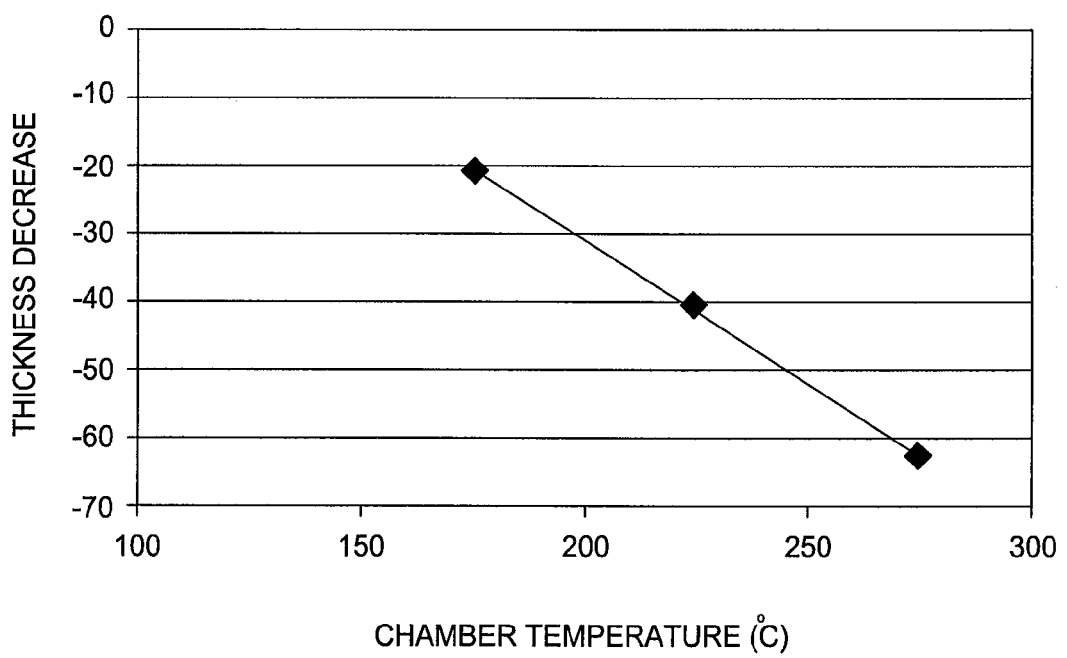
FIG. 2B schematically illustrates a correlation between chamber temperature and changes in thickness of a silicon dioxide film.

FIG. 2B schematically illustrates a correlation between chamber temperature and changes in thickness of a silicon dioxide film. The correlation shown in FIG. 2B corresponds to changes of thickness of a silicon dioxide film with an original thickness of about 400 to 500 angstroms after being exposed to an inert environment in a processing chamber at different temperatures. In FIG. 2B, the change of thickness and the temperature has the following correlation:

$$\text{Change in Thickness (Å)} = -0.42 \times \text{Temperature (° C.)} + 53.067$$

The correlation may be obtained by exposing a plurality of test substrates deposited with silicon dioxide films to inert environments with known temperature. The silicon dioxide films used in obtaining the correlation and the silicon dioxide film used in actual measurement should have similar properties, for example, similar thickness. The thermal exposure for obtaining the correlation and for temperature measurement should also be similar in terms of duration, gas flow rate, pressure, volume etc. In one embodiment, a correlation between temperature and change of thickness may be obtained for a particular chamber.

Figure 3A:
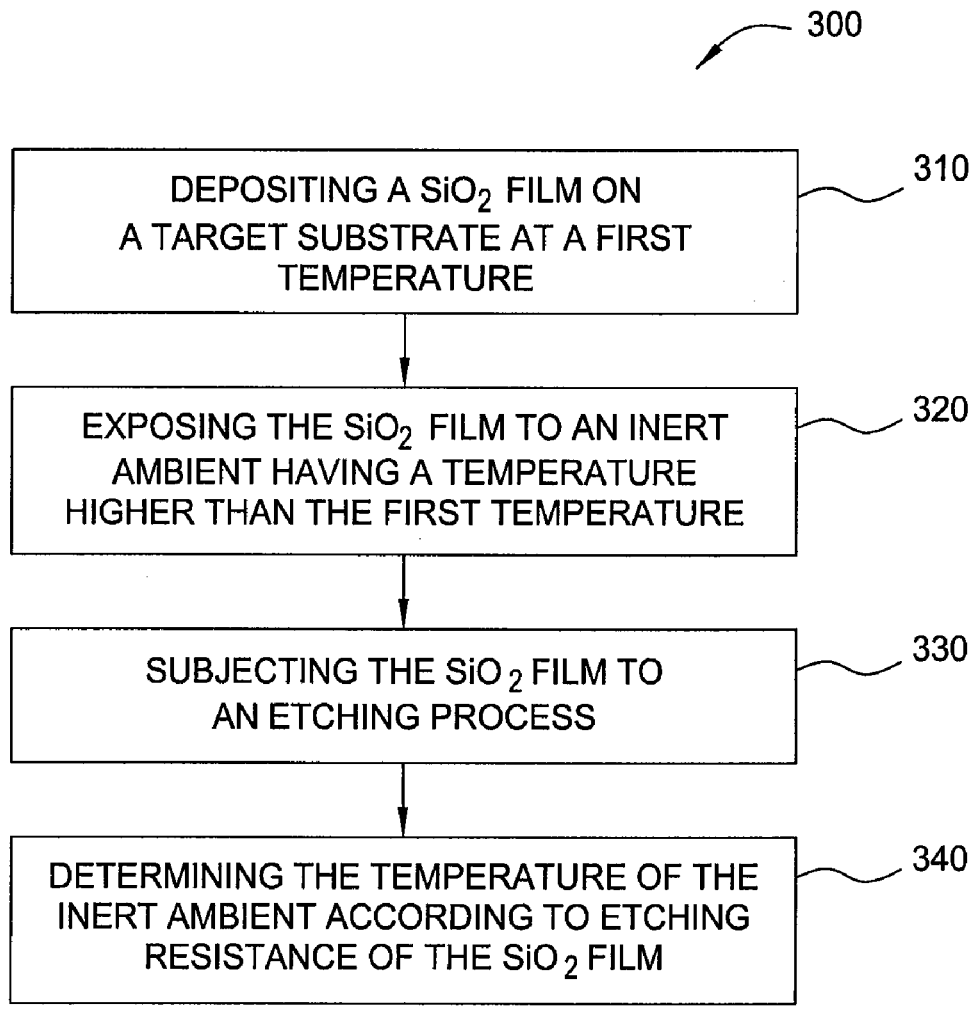
FIG. 3A illustrates a method for measuring chamber temperature from etching resistance of a silicon dioxide film in accordance with one embodiment of the present invention.

FIG. 3A illustrates a method 300 for measuring chamber temperature from etching resistance of a silicon dioxide film in accordance with one embodiment of the present invention. It has been observed that etching resistance of the uniquely prepared silicon dioxide film is responsive to thermal exposure. Therefore, after the test substrate with the silicon dioxide film is exposed to a temperature higher than its formation temperature, the etching resistance of the silicon dioxide film may be related to the temperature to which the silicon dioxide film is exposed.

In block 310, a unique silicon dioxide film is formed on a test substrate at a temperature lower than temperatures to be measured by the test substrate as described with FIG. 2A.

In block 320, the target film on the test substrate is exposed to an inert ambient having a temperature higher than the temperature at which the target film is deposited. In one embodiment, the temperature of the inert ambient may be at least 25° C. higher than the deposition temperature. The inert environment may be achieved by following one or more inert gas, for example to a processing chamber whose processing temperatures is to be measured.

After the test substrate is exposed to an inert environment, the test substrate may be removed from the inert environment and subjected to an etching process, as shown in block 330. The etching rate may be determined from change in thickness and etching duration. In one embodiment, a wet etching may be used to determine the etching resistance of the silicon dioxide film. The silicon dioxide film may be etched using a diluted hydrogen fluoride (HF). In one embodiment, the etching solution may be hydrogen fluoride and deionized (DI) water in a ratio of 1:200.

As shown in block 340, the temperature of the inert environment may be determined according to the etching resistance of the silicon dioxide film. In one embodiment, determination of the temperature of the inert environment may be achieved using a correlation between temperatures and etching rate of the silicon dioxide film.

Figure 3B:
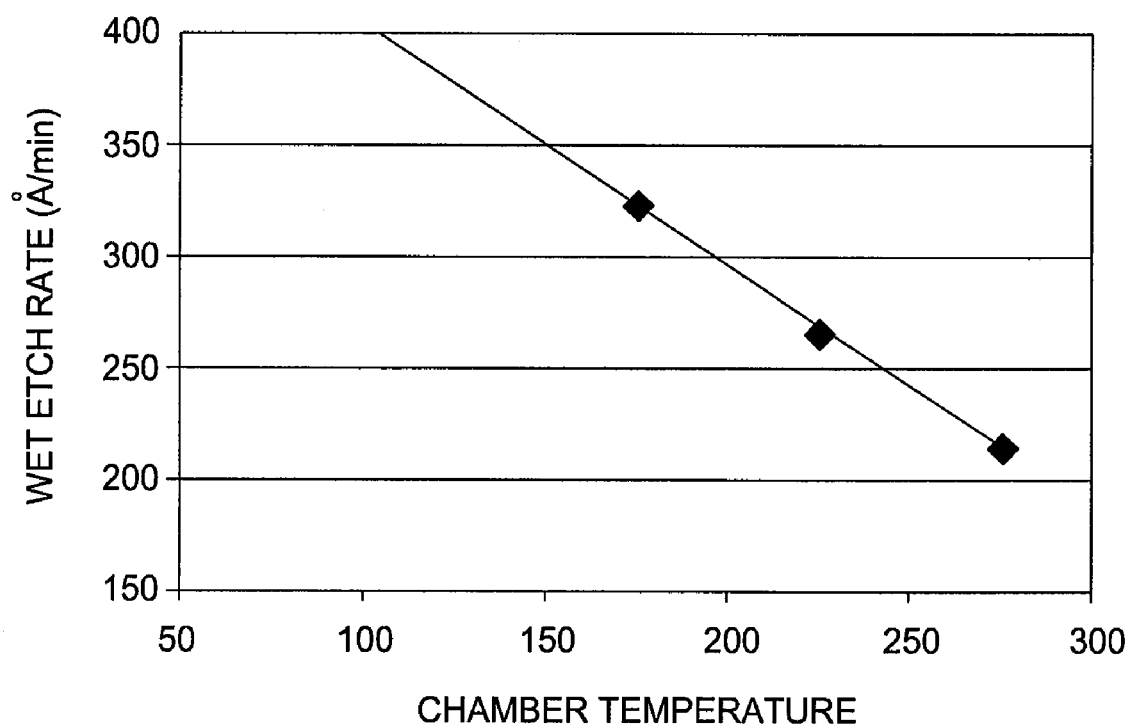
FIG. 3B schematically illustrates a correlation between chamber temperature and etching resistance of a silicon dioxide film.

FIG. 3B schematically illustrates a correlation between chamber temperature and etching resistance of a silicon dioxide film. The correlation shown in FIG. 3B corresponds to etching rate of a silicon dioxide film in a diluted hydrogen fluoride with an original thickness of about 400 to 500 angstroms after being exposed to an inert environment in a processing chamber at different temperatures. In FIG. 3B, the change of thickness and the temperature has the following correlation:

$$\text{Etching Rate (Å/minute)} = -1.087 \times \text{Temperature (° C.)} + 512.24$$

As discussed above, one or more properties of the silicon dioxide film may change after exposure to temperatures higher than the temperature at which the silicon dioxide film is formed. The changes of the one or more properties of the silicon dioxide film may be affected by the higher temperature exposed. However, other factors, for example, original thickness of the silicon dioxide film, flow rate and volume of the ambient environment, duration of the silicon dioxide film exposed to the ambient environment, ramp up speed of ambient environment, and temperature fluctuation of the ambient environment, may also more or less affect the changes of the silicon dioxide film. To ensure precise and accurate temperature measurement, especially for temperature measurement in a semiconductor processing chamber, a correlation between changes and temperatures may be obtained using substantially the same parameters as during the actual temperature measurement. The correlation may be used as a look up table for actual temperature measurement.

Figure 5:
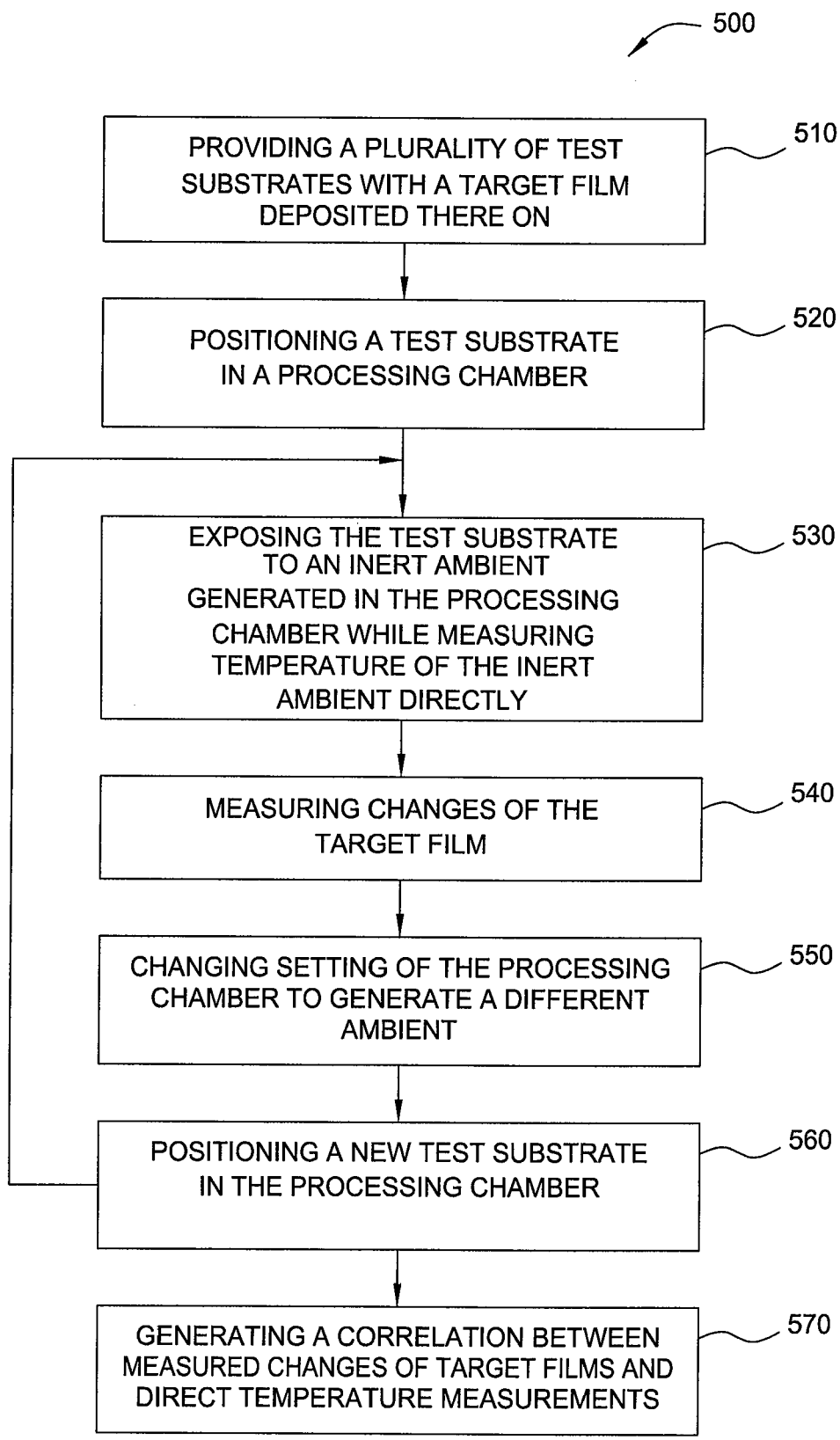
FIG. 5 illustrates a method for generating a correlation between chamber temperature and changes in properties of a silicon dioxide film in accordance with one embodiment of the present invention.

FIG. 5 illustrates a method 500 for generating a, correlation between chamber temperatures and changes in properties of a silicon dioxide film in accordance with one embodiment of the present invention.

Shown in block 510, a plurality of test substrates may be prepared each with a target film, i.e. silicon dioxide film, of substantially the same properties.

Shown in block 520, a test substrate may be positioned in a processing chamber in a location of interest.

Shown in block 530, an inert ambient may be generated in the processing chamber with the test substrate exposed to the inert ambient. The temperature near the test substrate may be measured directly, for example using one or more thermal couples.

Shown in block 540, after exposing to the inert ambient, the target film on the test substrate may be measured to obtain values of the one or more properties responsive to thermal exposure. At this point, the temperature of the processing chamber during process shown in block 530, measured directly, may be paired with values and/or changes of the one or more properties of the silicon dioxide film.

Shown in block 560, a new test substrate may be positioned in the processing chamber. Steps shown in blocks 530, 540, 550 may be performed repeatedly at different temperatures to obtain a plurality of temperature-property pairs.

Shown in block 570, a correlation between temperature and properties changes of the target film may be generated providing reference for future measurements. The correlation may be used as a look up table for temperature measurements of the same processing chamber or the same kind of processing chambers using test substrates having similar silicon dioxide films.

Different correlations may be generated for measurement of different thermal properties. Correlations may be unique to each processing chambers. For the propose of measuring processing temperature, the temperature of a processing chamber during the test process (for generating an inert ambient) may be slightly different from the temperature during actual process due to difference between inert gases used in the test process and the processing gases used in actual process. Therefore, a correction to the correlation may also be obtained to increase accuracy of the temperature measurement.

For a processing chamber configured to process multiple substrates, there are multiple processing positions which may have different temperature during processing. In this case, one or more testing substrates may be used to measure different locations within such a processing chamber.

Figure 6:
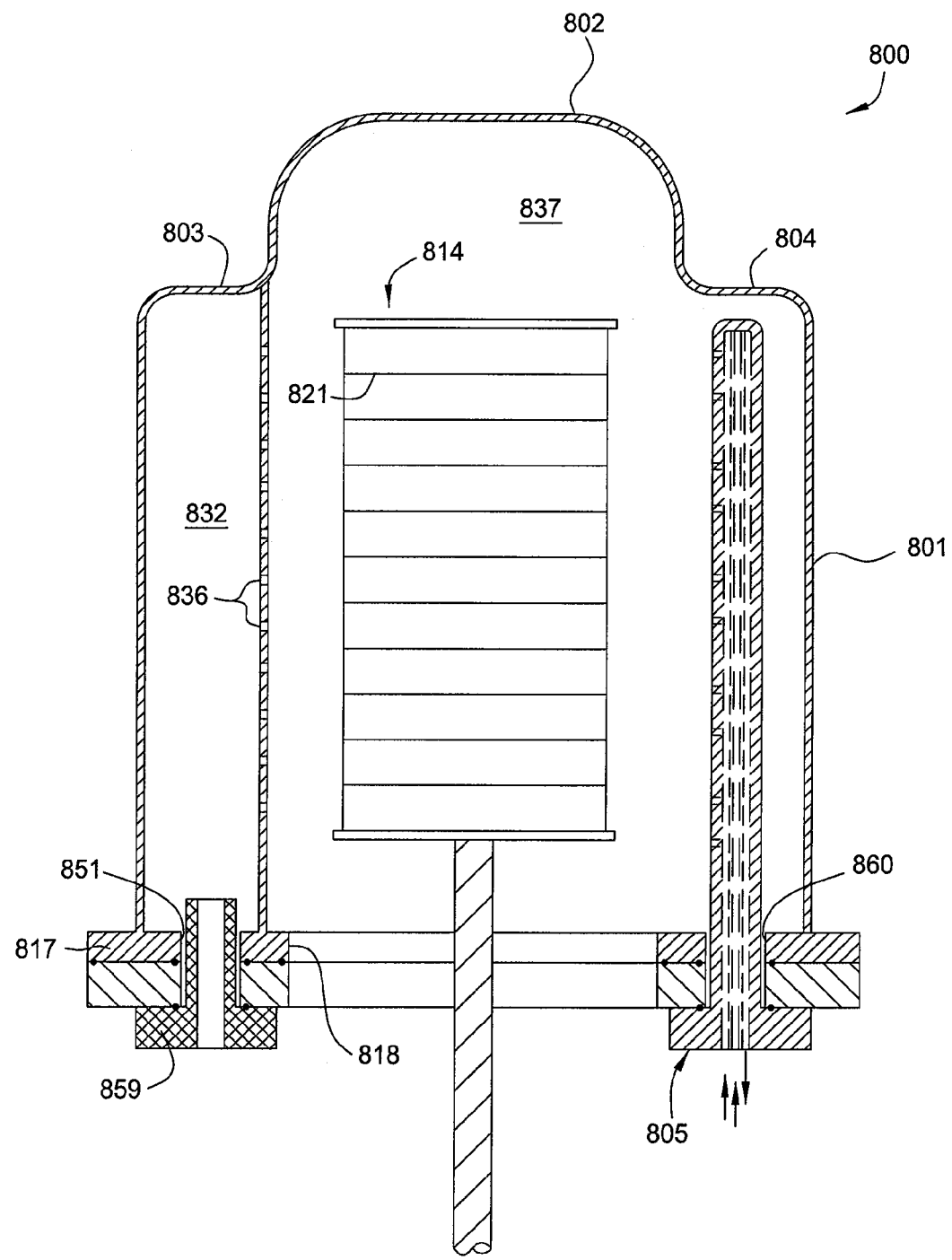
FIG. 6 schematically illustrates a sectional side view of a batch processing chamber which may benefit from methods of temperature measurements of the present invention.

FIG. 6 schematically illustrates a sectional side view of a batch processing chamber 800 which may benefit from methods of temperature measurements of the present invention.

The batch processing chamber 800 comprises a quartz chamber 801 having a cylindrical chamber body 802, an exhaust pocket 803 on one side of the chamber body 802, and an inject pocket 804 opposing the exhaust pocket 803. The chamber body 802 defines a processing volume 837 which is configured to accommodate a plurality of substrates 821 during processing.

The quartz chamber 801 has opens at bottom and has a flange 817 around the bottom. Both the exhaust pocket 803 and the inject pocket 804 are open at the bottom of the quartz chamber 801.

An exhaust opening 851 is configured for an exhaust conduit 859 to be inserted into the exhaust pocket 803. A center opening 818 is configured for a substrate boat 814 to transfer the substrates 821 to and from the processing volume 837. An inject openings 860 are configured for an inject assembly 805 to be inserted into the inject pocket 804.

The inject assembly 805 is configured to supply one or more processing gases to the processing volume 837 and the exhaust conduit 859 connects the processing volume 837 to a vacuum source for maintaining a low pressure environment in the processing volume 837.

The quartz chamber 801 is generally heated by heaters surrounding the chamber body 802 so that the processing volume 837 may be in an elevated temperature during processing. Uniformity among the plurality of substrates 821 being processed in the batch processing chamber 800 is critical. Temperature difference within the processing volume 837 is one of the factors undermines uniformity. To access temperatures within the processing volume, one or more test substrates in accordance with the present invention may be disposed in the substrate boat 814 to measure temperatures in the processing volume 837 and provide assessment to temperature uniformity among a batch of substrates being processed.

In another embodiment, property changes across a test substrate may be used to provide temperature exposure across a substrate being processed and provide assessment to temperature uniformity within a substrate.

While the foregoing is directed to embodiments of the present invention, other and further embodiments of the invention may be devised without departing from the basic scope thereof, and the scope thereof is determined by the claims that follow.

What is claimed is:

1. A method for measuring temperature, comprising:
    forming a target film on a test substrate at a first temperature, wherein the target film has one or more properties responsive to thermal exposure;
    exposing the target film to an environment at a second temperature in a range higher than the first temperature;
    measuring the one or more properties of the target film after exposing the target film to the environment at the second temperature; and
    determining the second temperature according to the measured one or more properties.

2. The method of claim 1, wherein the target film is a silicon dioxide ($SiO_2$) film formed by a low temperature atomic layer deposition (ALD).

3. The method of claim 2, wherein forming the target film comprises:
    exposing the test substrate to a silicon precursor comprising hexachlorodisilane (HCDS); and
    exposing the test substrate to a catalyst comprising pyridine and simultaneously exposing the test substrate to an oxidizing source comprising water ($H_2O$).

4. The method of claim 1, wherein the second temperature is about at least 25° C. higher than the first temperature.

5. The method of claim 1, wherein the second temperature is between about 50° C. to the melting temperature of silicon.

6. The method of claim 1, wherein the one or more properties comprise one of thickness, dry etching rate, and wet etching rate.

7. The method of claim 1, further comprising correlating values of the one or more properties of the target film with temperatures of an inert environment the target film has been exposed to after formation.

8. A method for measuring processing temperature of a process performed in a semiconductor processing chamber, comprising:
    depositing a target film on a test substrate, wherein one or more properties of the target film are responsive to thermal exposure;
    positioning the test substrate in the semiconductor processing chamber;
    performing a test process to the test substrate positioned in the semiconductor processing chamber, wherein the test process has substantially the same temperature settings as the process;
    obtaining values of the one or more properties of the target film after the test process; and
    determining temperature of the test process performed according to the obtained values of the one or more properties of the target film after the test process.

9. The method of claim 8, further comprising correlating values of the one or more properties of the target film with temperatures of an inert environment the target film has been exposed to after formation.

10. The method of claim 8, wherein the processing temperature of the process is between about 50° C. to the melting temperature of silicon.

11. The method of claim 8, wherein the target film comprises a silicon dioxide ($SiO_2$) film deposited at a temperature lower than the temperature of the test process.

12. The method of claim 11, wherein the silicon dioxide film has a thickness between about 100 angstroms to about 10 microns.

13. The method of claim 11, wherein depositing the target film comprises:
    exposing the test substrate to a silicon precursor comprising hexachlorodisilane (HCDS); and
    exposing the test substrate to a catalyst comprising pyridine and simultaneously exposing the test substrate to an oxidizing source comprising water ($H_2O$).

14. The method of claim 8, further comprising obtaining original values of the one or more properties of the target film prior to the performing the test process.

15. The method of claim 14, wherein the one or more properties comprise thickness of the target film.

16. The method of claim 14, wherein determining temperature of the test process comprises:
    determining changes of the one or more properties of the target film from the original values and the obtained values after the test process; and
    determining the temperature of the test process according to the changes of the one or more properties.

17. The method of claim 8, wherein the one or more properties comprise one of rate of dry etching or rate of wet etching.

18. The method of claim 17, wherein obtaining one or more properties of the target film comprises performing one of dry etching or wet etching to the target film.

19. A method for measuring temperature, comprising:
depositing a silicon dioxide film on a test substrate at a first temperature, wherein the silicon dioxide film has one or more properties responsive to thermal exposure;
exposing the silicon dioxide film to an inert environment at a second temperature, wherein the second temperature is higher than the first temperature;
obtaining values of the one or more properties of the silicon dioxide film to the inert environment at the second temperature;
determining the second temperature according to obtained values of the one or more properties of the silicon dioxide film.

20. The method of claim 19, wherein depositing the silicon dioxide film comprises:
exposing the test substrate to a silicon precursor comprising hexachlorodisilane (HCDS);
exposing the test substrate to a catalyst comprising pyridine; and
exposing the test substrate to an oxidizing source comprising water ($H_2O$).

21. The method of claim 19, wherein the one or more properties comprise one of thickness, dry etching rate and wet etching rate.

22. The method of claim 19, wherein the silicon dioxide film has a thickness between about 100 angstroms to about 10 microns.

23. The method of claim 19, further comprising correlating values of the one or more properties of the silicon dioxide film with temperatures the silicon dioxide film has been exposed to after formation.

* * * * *